United States Patent [19]

De La Moneda

[11] 4,115,794

[45] Sep. 19, 1978

[54] CHARGE PUMPING DEVICE WITH INTEGRATED REGULATING CAPACITOR AND METHOD FOR MAKING SAME

[75] Inventor: Francisco H. De La Moneda, Reston, Va.

[73] Assignee: International Business Machines Corporation, Armonk, N.Y.

[21] Appl. No.: 861,311

[22] Filed: Dec. 16, 1977

Related U.S. Application Data

[63] Continuation of Ser. No. 613,781, Sep. 16, 1975, abandoned.

[51] Int. Cl.² .............................................. H01L 29/78
[52] U.S. Cl. ........................... 357/23; 307/221 D; 357/20; 357/24; 357/41; 357/51; 357/91; 365/182
[58] Field of Search ............................... 365/182, 183; 307/221 D; 357/23, 24, 41, 91, 51, 20

[56] References Cited

U.S. PATENT DOCUMENTS

| | | | |
|---|---|---|---|
| 3,794,862 | 2/1974 | Jenne | 357/23 |
| 3,860,454 | 1/1975 | DeWitt et al. | 357/91 |

OTHER PUBLICATIONS

D. Spampinato et al., "Single Electrode One-Device Cell," IBM Tech. Discl. Bull., vol. 15, #6, Nov. 1972, pp. 2019-2020.

M. Ebel et al., "A 4096-Bit High Speed ECL Compatible Ram, " 1975 IEEE Int. S-S Ckts. Conf. Proc., Feb. 13, 1975, pp. 104, 105, 219.

*Primary Examiner*—Joseph E. Clawson, Jr
*Attorney, Agent, or Firm*—John E. Hoel

[57] ABSTRACT

An improved charge pumping device is disclosed for charge storage memory elements and substrate bias control. By selectively ion-implanting the substrate of the charge pump, its output current is substantially increased and its losses by charge dissipation are reduced. Charge pumps are used to charge a substrate-series capacitor combination to a desired bias point. In the substrate bias application, by integrating the series capacitor with the charge pump on the semiconductor chip and making the capacitor an integral part of a low resistance conductive blanket implant, the voltage regulation of the biasing circuit is improved.

1 Claim, 13 Drawing Figures

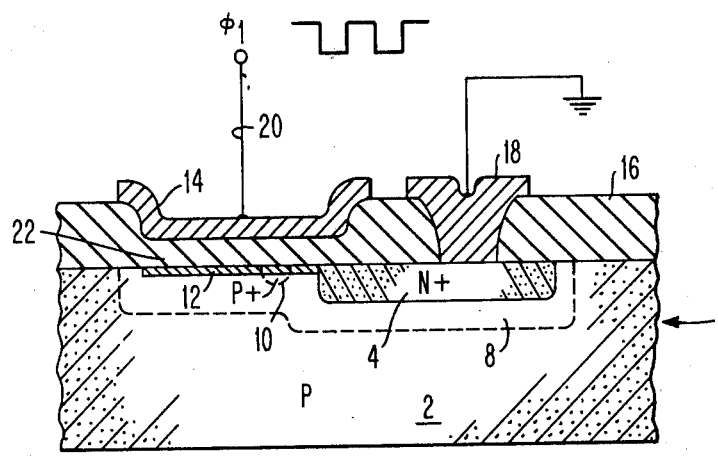
FIG. 3
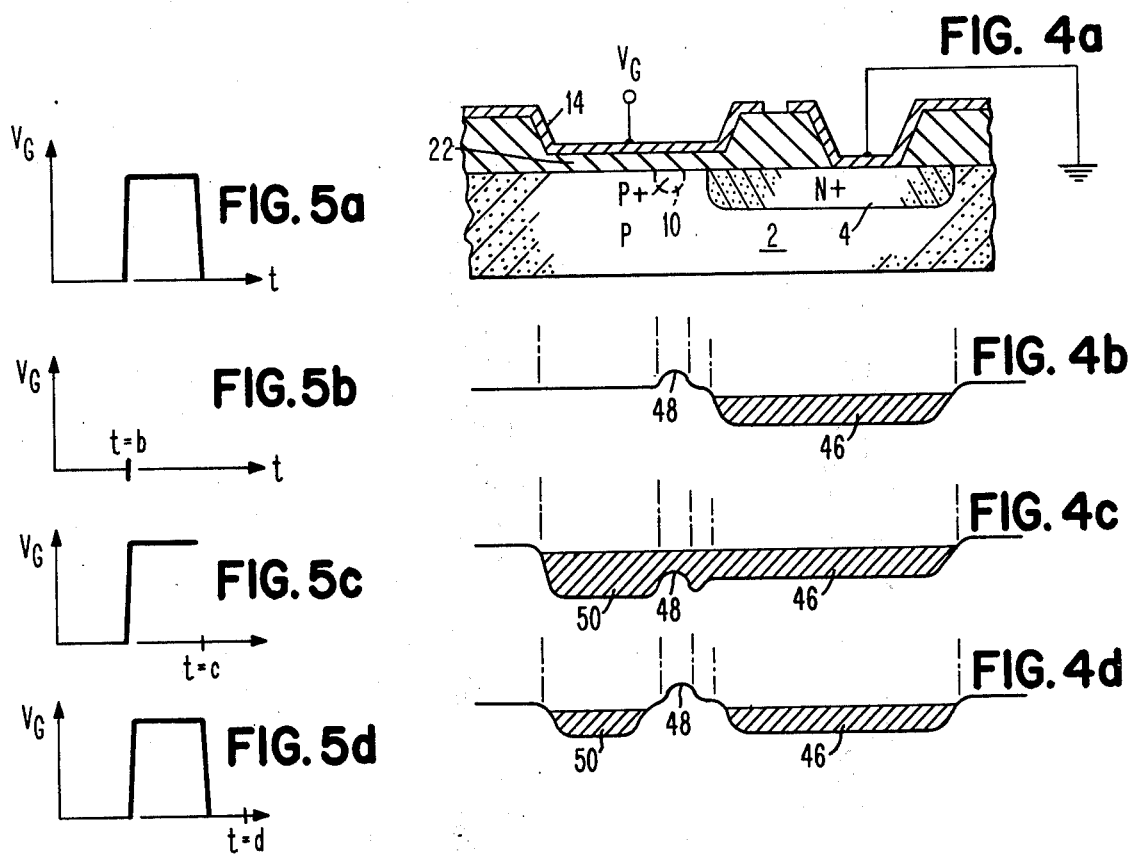
FIG. 4a
FIG. 5a
FIG. 5b
FIG. 4b
FIG. 5c
FIG. 4c
FIG. 5d
FIG. 4d
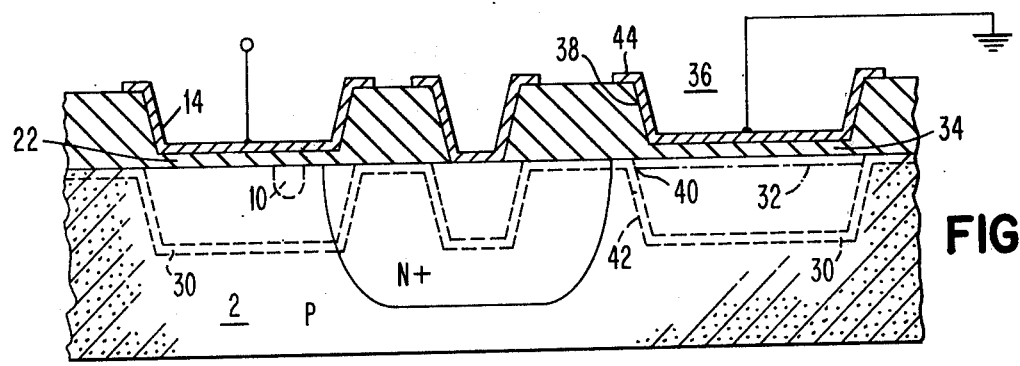
FIG. 6

CHARGE PUMPING DEVICE WITH INTEGRATED REGULATING CAPACITOR AND METHOD FOR MAKING SAME

This is a continuation of application Ser. No. 613,781 filed Sept. 16, 1975 now abandoned.

FIELD OF THE INVENTION

The invention disclosed herein relates generally to MOSFET integrated circuits and more particularly relates to charge pumping devices for controlling the substrate voltage thereof.

BACKGROUND OF THE INVENTION

MOSFET integrated circuits require their semiconductor substrate to have a fixed voltage bias. Early IGFET integrated circuits employed the use of an external voltage bias source requiring an additional electrical connection to the substrate. The prior art improved upon this approach through the development of the field effect charge pump for injecting charge into the substrate, such as is disclosed in U.S. Pat. No. 3,794,862, a cross-sectional view of which is shown in FIG. 1. The prior art charge pump comprised a P type substrate 2 in which has been formed the N type source region 4, produced by known processes and techniques. For example, phosphorous impurities can be diffused through openings in a thick silicon dioxide dielectric layer disposed on the surface of a single crystal silicon substrate to form the N+ source regions in the P type substrate. A thin oxide layer 22 is then grown in the gate region overlapping the source 4. The gate electrode 14 is deposited over thin oxide layer 22. The source electrode 4, supplies negative charge to be injected into the substrate 2, when the potential of the gate electrode 14 exceeds the thin oxide threshold voltage, $V_T$, thereby inverting the conductivity of the substrate beneath the thin oxide layer 22. The supplying of negative charge for the substrate may be described as "pumping" charge into the substrate. The clock signal $\phi_1$, connected to the gate electrode 14, controls the charge pumping operation. This biasing circuit is employed to inject charges into a substrate-capacitor series combination with one side of the capacitor being grounded.

A square wave voltage signal $\phi_1$ is used to pump minority carriers from the diffusion 4 into the substrate 2. When this prior art charge pumping circuit is used to bias the substrate of a semiconductor chip containing a large number of reverse biased diffusions, its operation deteriorates since a fraction of the pump current is lost to the leakage current of these diffusions. Since these reverse leakage currents are erratic and difficult to reduce, it is then of great interest to insure that the charge pump is able to drive current well above the leakage level. One way to do this might be to increase the area of the gate region 22. However, this is expensive in terms of silicon area. A better way would be to improve the charge pump efficiency that is, reducing the fraction of electrons that are lost back to the source diffusion 4 during each pumping cycle, thereby increasing the net current output.

The principles governing charge pumping in MOS transistor devices are explained in J. S. Brugler, et al., "Charge Pumping in MOS Devices," IEEE Transactions on Electron Devices, Vol. ED-16, No. 3, pages 297-303, 1969. There, the charge pump current is expressed by the sum of the following components:

$$I_p = A \cdot f_p \cdot (C_{ox}(V_G - V_T) + qN_{ST}) \tag{1}$$

Here, $A$ is the area of the plate 14 gating the source diffusion, $f_p$ is the frequency of the pumping wave-form $\phi_1$, $C_{ox}$ is the thin oxide capacitance per unit area, $V_G$ is the most positive voltage of the signal $\phi_1$, $V_T$ is the threshold voltage corresponding to the thin oxide, $q$ is the unit charge of an electron, and $N_{ST}$ is the electron surface state density. The first term within the parenthesis of equation 1 is the component due to the compensation of the injected minority carriers by majority carriers from the bulk of the substrate 2 and the second component in equation 1 is due to recombination through fast surface states. If a charge pump with high current capability is desired, it is necessary to let the first component of equation 1 become dominant. This first term of equation 1 is called the geometric component since conditions favorable to its existance depend on the geometry of the diffusion 4. It is shown in the Brugler, et al., reference that the best geometry is an annular gated diode with its junction at its center. This is because the reflow of charge from the substrate into the junction meets an increasingly larger resistance with diminishing radius due to the reduced cross-sectional area that the current has to flow through. Therefore, charge losses to the source diffusion 4 can be minimized and the pump efficiency increased. However, this approach has a significant drawback in that circular shapes are difficult to render in the photolithographic masking processes necessary to construct the diffused region 4. What the semiconductor art needs is an improved charge pumping structure which will enhance the efficiency of the field effect transistor type charge pump.

OBJECTS OF THE INVENTION

It is therefore one object of the invention to improve the pumping efficiency for an FET type charge pump.

It is yet another object of the invention to control the substrate voltage bias in a large scale integrated circuit, in an improved manner.

It is still another object of the invention to provide an improved charge pumping mechanism for charging capacitive elements in a large scale integrated circuit.

It is still a further object of the invention to provide an improved charge pumping mechanism for refreshing the charge stored on storage capacitances in a large scale integrated circuit memory array.

SUMMARY OF THE INVENTION

These and other objects, features, and advantages of the invention will be accomplished by the ion-implanted charge pumping device disclosed herein.

The charge pumping device comprises a semiconductor substrate of a first conductivity type having a first region in the surface of the substrate of a second conductivity type, connected to a biasing potential to prevent forward biasing of the p-n junction formed thereby. An insulating layer is deposited on the surface of the substrate and the gate electrode is located over the substrate and overlapping the first region, separated by the insulating layer. A second region is located in the surface of the substrate adjacent to the first region, having the first conductivity type of a magnitude greater than that of the substrate. Charge carriers of the second conductivity type are injected from the first region into the substrate beneath the gate after the application of a voltage signal inverting the conductivity of the substrate beneath the gate and are prevented by the second region, from rediffusing into the first region after the voltage signal is removed from the gate. The second region is an ion-implanted charge barrier. The device may be used as a charge pumping mechanism for charge storage memory elements or a charge coupled device array, as well as for substrate bias control. The distribution of the resulting biasing voltage across the semiconductor chip in the substrate bias control application, is enhanced by an ion-implanted blanket layer of the first conductivity type having one edge adjacent to the gate region of the charge pumping device. In addition, a capacitor with an ion-implanted plate may be used to improve the voltage regulation of the biasing circuit. A method employing ion-implantation, is disclosed for making the device.

DESCRIPTION OF THE FIGURES

These and other objects, features, and advantages of the invention will be more particularly described with reference to the accompanying drawings.

FIG. 2b is a top view of the device shown in cross-section in FIG. 2a.

FIG. 3 is a cross-sectional view of the device of FIG. 2a, when the gate 14 is positive.

FIG. 4a is another cross-sectional view of the improved charge pumping device.

FIG. 4b shows the electron potential and corresponding electron concentration in the structure of FIG. 4a when no gate voltage $V_G$ at a time $t = b$ after a period of no charge pumping.

FIG. 4c illustrates the electron potential and electron concentration as current is being injected from the source electrode diffusion 4 into the substrate 2 in FIG. 4a. For the voltage $V_G$ having a positive value at a time $t = c$, as is shown in FIG. 5c.

FIG. 4d illustrates the electron potential and electron concentration for the structure of FIG. 4a, after the voltage $V_G$ has been turned off at a time $t = d$, as is shown in FIG. 5d.

FIG. 5a illustrates one full cycle of the gate signal $V_G$.

FIG. 5b illustrates the value of $V_G$ as being below the threshold voltage of the MOS thin oxide, at the time $t = b$, which corresponds to the electron distribution shown in FIG. 4b.

FIG. 5c illustrates the value of the voltage $V_G$ as being above the threshold voltage of the MOS thin oxide, at a time $t = c$, which corresponds to the electron distribution shown in FIG. 4c.

FIG. 5d illustrates the return of the voltage $V_G$ to below the threshold voltage, at a time $t = d$ which corresponds to the electron distribution shown in FIG. 4d.

FIG. 6 illustrates the ion-implanted blanket layer for redistributing the bias voltage across the semiconductor chip and the ion-implanted capacitor plate employed to improve voltage regulation of the biasing circuit.

DISCUSSION OF THE PREFERRED EMBODIMENT

Figure 1:
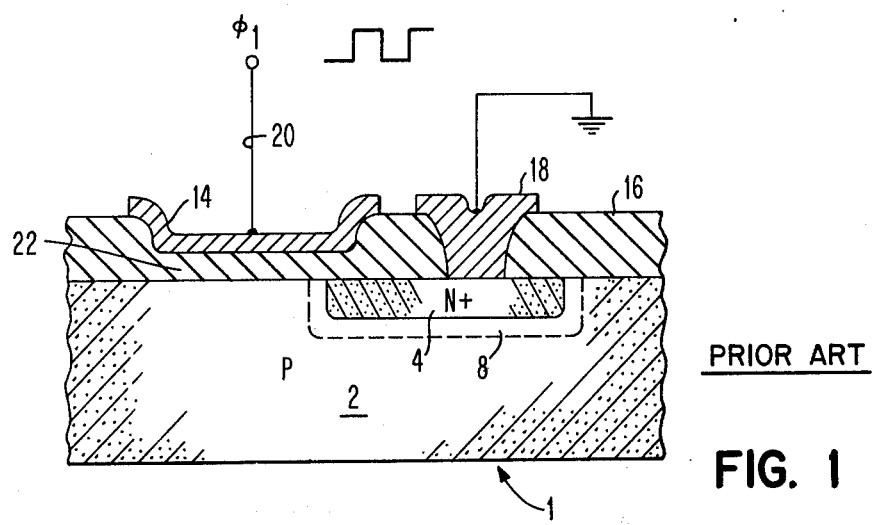
FIG. 1 is a cross-sectional view illustrating the prior art IGFET type charge pumping device.
Figure 2A:
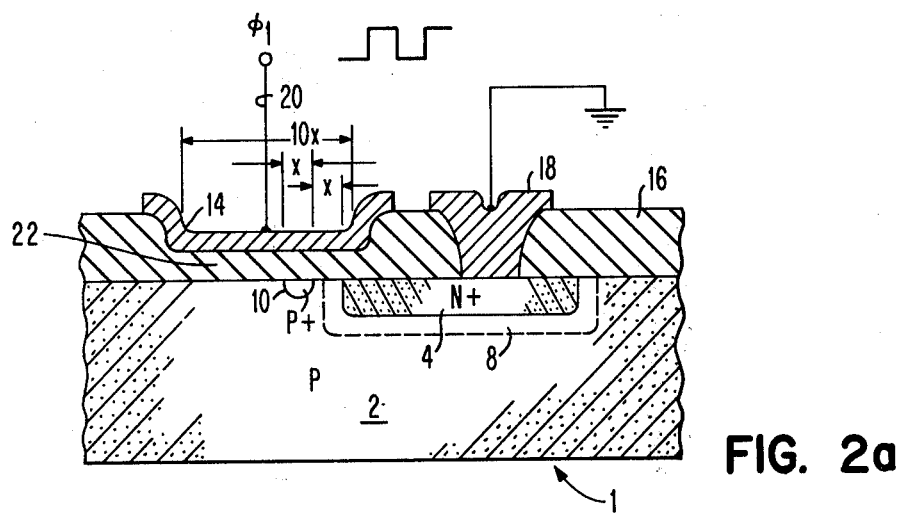
FIG. 2a is a cross-sectional view illustrating the improved IGFET type charge pumping device disclosed herein with the gate 14 at a negative potential.

FIG. 2a illustrates the ion-implanted charge pump. By ion-implanting impurities in the region 10 adjacent to the junction, having the same conductivity type as the substrate 2, a potential barrier 48 to electron flow out of the substrate is created. The threshold voltage $V_{TH}$ of the implanted barrier region 10 is higher than the threshold voltage $V_{TL}$ of the unimplanted portion of the substrate beneath the gate oxide, due to the higher concentration of substrate-type dopant atoms. The barrier 10 effectively impedes the electron flow only in the direction from the substrate into the junction of the diffusion 4 with the substrate 2, as is explained below.

Figure 2B:
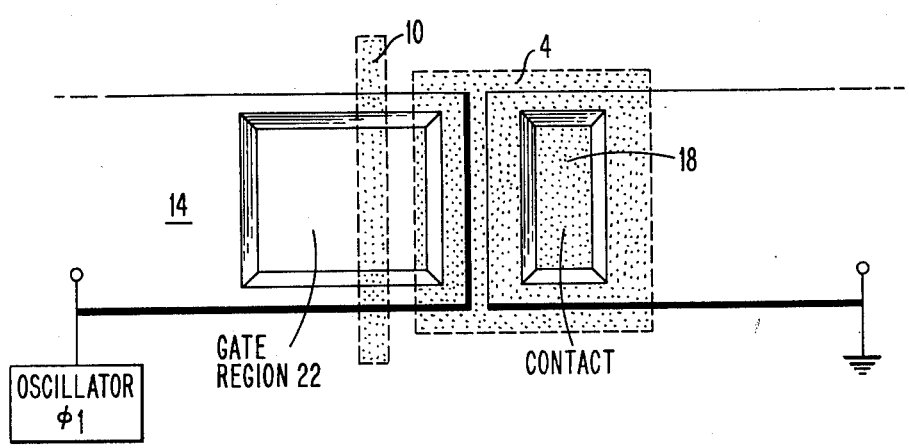

FIG. 2b illustrates a top view of the charge pumping device shown in cross-section in FIG. 2a. The electrode 18 is connected to ground potential and the electrode 20 is connected to a source of periodic positive voltage pulses of sufficient magnitude to invert the conductivity of the semiconductor region beneath the gate 14. The potential of electrode 18 keeps the p-n junction from being forward biased. FIG. 2b illustrates the contour of the depletion zone 8 and the electron concentration 12 when the potential of gate 14 is below $V_{TL}$. Correspondingly, the FIG. 3 shows the cross-sectional view of the charge pumping device, with the configuration of the depletion region 8 and the electron concentration 12 which results when the potential of gate 14 is above $V_{TH}$, inverting the semiconductor region beneath gate 14.

The substrate 2 is of P type conductivity having a concentration of approximately $7 \times 10^{15}$ dopant atoms per cubic centimeter. The diffused region 4 is of N+ conductivity having a dopant atom concentration of approximately $10^{°}$atoms per cubic centimeter and can be, for example, phosphorous, arsenic, or antimony. The barrier region 10 is implanted with dopant ions selected from the group consisting of boron, aluminum, gallium, or indium, and will have a dopant concentration of approximately $10^{17}$ atoms per cubic centimeter. For example, masking the field region with a photoresist, boron ions are implanted at 24 Kev through a 500 Angstrom gate oxide to produce a barrier region 10 having a dopant dosage of $6 \times 10^{11}$ atoms/cc. The device is annealed at 900° C. for 20 minutes, producing a 1 volt shift in the threshold voltage $V_{TL}$. Relative size of the structures shown in FIG. 2a would be, for example, a horizontal width $\chi$ for the barrier region 10 of approximately 2 microns, a separation distance $\chi$ between adjacent sides of the region 10 and the diffusion 4 of approximately 2 microns, a width $10\chi$ for the gate electrode 14 of approximately 20 microns, a gate thickness in the thin oxide region 22 of approximately 500 to 700 Angstroms, and an implantation depth for the region 10 of approximately 0.08 microns. The depth of the diffusion region 4 is approximately 1 micron. Although these dimensions and dopant concentrations may vary over a range, their relative proportions should remain approximately the same.

It should be recognized, of course, that the conductivity types can be reversed in the improved charge pump shown in FIG. 2a so that holes will be injected into an N type substrate 2. In this reverse conductivity case, the substrate conductivity will be N type having a dopant atom concentration of approximately $1 \times 10^{15}$ atoms per cubic centimeter and the diffused region 4 conductivity will be P type having a dopant atom concentration of approximately $10^{20}$ atoms per cubic centimeter. The charge barrier region 10 will also be N type and will be ion-implanted with dopant atoms selected from the group consisting of nitrogen, phosphorous, arsenic, and antimony, having a dopant atom dosage of approximately $6 \times 10^{11}$ atoms per cubic centimeter. The relative dimensions of the device in this reverse conductivity embodiment for the injection of holes into an N type substrate 2 will be the same as was described above for the electron ejection into a P type substrate embodiment. In the hole injection type embodiment, the electrode 18 is connected to a reference potential and the electrode 20 is connected to a source of periodic negative voltage pulses having a magnitude sufficient to invert the conductivity of the semiconductor region beneath the gate 14. The following description will be with reference to the electron injection embodiment discussed previously. It will be appreciated, however, that the discussion would be equally applicable to the hole injection embodiment as well.

In the electron injection embodiment of the charge pumping device, the barrier region 10 effectively impedes the electron flow only in the direction from the substrate 2 into the junction of the diffusion region 4. FIGS. 4b through 4d in conjunction with FIGS. 5b through 5d illustrate how the electron concentration is redistributed during one cycle of the waveform $V_G$ applied to the gate 14. In FIG. 4b, at time $t = b$, the gate 14 has a relatively low potential below $V_{TL}$ as is shown in FIG. 5b, and the electrons stay in the N+ diffusion region 4. In FIG. 4c, at time $t = c$, the electron potential in the substrate 2 is lowered by the increased positive voltage $V_G$ at the gate 14 as is shown in FIG. 5c. At this time the electrons spill over the potential barrier 48 formed by the region 10 and into the substrate 2. In IGFET device terminology, this is equivalent to saying that the gate potential for the gate 14 is sufficiently large to invert the highly doped implanted region 10. Thus, the implanted barrier 10 does not effectively impede the electron flow from the diffused region 4 to the substrate 2. In FIG. 4d, at a later time $t = d$, the gate 14 has a potential $V_G$ which is relatively low as is shown in FIG. 5d. At this time, the injected electrons beneath the gate 14, bounded by the potential barrier 48, are constrained to stay in the substrate 2 where they eventually recombine with holes provided by the P type substrate 2, thus establishing the pumping current. The potential barrier 48 provided by the region 10 prevents the backward rediffusion into the diffusion region 4, of the previously injected electrons beneath the gate region. Thus, it is seen that the presence of the ion-implanted charge barrier 10 increases the efficiency of the charge pumping action of the device, by increasing the net electron charge injected into the substrate during each pumping cycle.

It should be noted that by using the narrow implanted stripe 10, shown to better advantage in the top view of FIG. 2b, having a high threshold voltage, $V_{TH}$, surrounded by a low doped substrate 2 with correspondingly low threshold voltage $V_{TL}$, it is possible to independently optimize the two main characteristics which determine current capability in a MOSFET charge pump. First, the low $V_{TL}$ leads to a higher pump current $I_p$, as is indicated by equation 1. Secondly, the high $V_{TH}$ reduces the loss to the diffusion 4, of electrons stored in the substrate, thereby increasing the pumping efficiency. This can be understood by regarding the two large electron reservoirs 46 and 50 of FIG. 4d as the source and drain of an MOS device with a high $V_{TH}$. Since the potential $V_G$ of the gate 14 is relatively low, $V_{TH}$ insures a low subthreshold leakage current between the two reservoirs. This $V_{TH}$ will also reduce the current injecting electrons into the substrate as shown in FIG. 4c. However, this does not have any detrimental effect on the output pump current level which is drawn from the electron charge stored in the substrate 2 and this charge reaches a steady state value proportional to $(V_G - V_{TL})$ after a few pumping cycles.

For an annular diode, if an attempt is made to improve the pump storage capacity by using a uniformly low doped substrate, the isolation between pumped charge and the source diffusion is impaired. Conversely, if the substrate doping is high to improve the isolation, then the storage capacity goes down. For an annular diode, some fraction of the electrons injected into the substrate flows back into the junction aided by a diffusion gradient and impeded by the resistance of the annular geometry. Since for the disclosed charge pumping device, the aiding gradient is eliminated by using $V_{TH}$, its efficiency is higher than in the annular device.

Thus, it is seen that the ion-implanted charge pumping device has three distinctive advantages over those with uniformly doped substrates. They are: freedom to use a low doped substrate resulting in a higher output current capability; the use of an implant to define a high threshold voltage isolation region or a potential barrier, increasing the pump efficiency; and the ability to dispense with the layout of circular shapes which are not needed to achieve high efficiency.

In the application of the disclosed charge pumping device to producing a substrate biasing voltage, good voltage regulation requires the uniform distribution of the resulting bias voltage throughout the chip and storage of that biasing voltage on an external capacitor. This can be readily achieved in an array of IGFET circuits by integrating this capacitor 36 into the chip in such a way that one of its plates is a highly doped layer 30 buried within the substrate 2, as shown in FIG. 6. This plate 30, in addition, serves as a low resistance distribution bus across the chip substrate. Consequently, all of the functional circuits within the array will be at substantially the same substrate biasing voltage.

A technique for fabricating this capacitor 36 follows: First, a field blanket ion-implantation of impurities of the same type as those of the substrate is done after growth of the thin oxide layer 22 in a conventional four-mask MOSFET process. The depth of the implantation layer 30 will follow the profile of the oxide layer 16 lying above it, as is illustrated in FIG. 6. For example, 200 Kev boron ions are implanted through the 5000 Angstrom thick oxide 16 at a dose of $2 \times 10^{12}$ atoms/cc, forming the region 30 and 42. The substrate is annealed at 900° C. for 20 minutes. This results in shifting the threshold voltage in the field region by 16 volts.

H. Christie, et al., "N-Channel MOSFET Field Protection by Non-masking Boron Ion-implantation," Technical Digest of International Electron Devices Meeting, page 464–466, 1973, teaches how this type of blanket implantation may be used to obtain a high field oxide threshold voltage and thus eliminate the device-to-device surface leakage. This feature is very desirable for chips using the charge pumping device disclosed herein, since, as pointed out above, leakages degrade the performance of the charge pump. Substrate capacitor plate 30 is finished by implanting a layer 32 of the same type as that of the blanket implant 30, through the thin oxide 34 of the capacitor 36 as is shown in FIG. 6, at the same time the charge pump barrier 10 is implanted. Due to the taper of the oxide walls 38, the edges 40 of the last implant 32 are not contiguous with the edges 42 of the blanket implant 30. However, both edges 40 and 42 merge due to the annealing heating cycles that follow. Thus the blanket implant 30 and the thin oxide implant 32 become the substrate plate of the capacitor 36. The grounded plate consists of the metallization pattern 44 deposited over the thin oxide 34. This capacitor 36 should be laid out around the LSI chip periphery in order to better distribute the voltage generated by the charge pumping device. As the layout in conjunction with the low resistance capacitor plate 30 will minimize the detrimental effects of a high resistivity substrate 2 on the voltage regulation of the biasing circuit.

In summary an MOSFET charge pumping device has been disclosed with a high capacity to store charge and a high efficiency in conjunction with the good voltage distribution. Some of the advantages of this combination include the following. Because of the improved performance of the charge pump, it requires a smaller area for a given pumping frequency $\phi_1$, than that required by conventional charge pumping devices in order to achieve the same level of output current. Diffusion of the conductive plate 30 with the plate 32 of the capacitor 36 leads to improved voltage regulation. This is particularly important for logic circuit chips where the occurrence of current noise is unpredictable and the only way to reduce their selfbiasing effects is to provide a good voltage regulation. Finally, integration of the capacitor 36 into the chip results in a reduced fabrication cost which counterbalances the extra expense of the additional mask needed for the implantation of the potential barrier 10 and capacitor plate 32.

It should be recognized, of course, that the charge pumping device disclosed in FIG. 2a can be employed as the charge source for replenishing the charge in a solidstate memory array, by means of grounding the substrate to and connecting the electrode 18 to the memory capacitive cell to which the desired charge is to be supplied.

While the invention has been particularly shown and described with reference to the preferred embodiments thereof, it will be understood by those skilled in the art that the foregoing and other changes in form and details can be made therein without departing from the spirit and scope of the invention.

I claim:

1. A charge pumping device, comprising:
    a semiconductor substrate of a first conductivity type;
    a first region in the surface of said substrate of a second conductivity type, biased with respect to said substrate;
    an insulating layer deposited on the surface of said substrate, having a relatively thin portion located over the semiconductor substrate and overlapping at least one of the edges of said first region defining a gate region;
    a gate electrode located over said thin portion of the insulating layer and overlapping said first region, connected to a source of periodic voltage pulses having a first state and a second state with respect to a reference potential;
    a voltage source connected between said first region and said reference potential and of such value and polarity to reverse bias the p-n junction formed by said first region except during said first state of the voltage source applied to the gate;
    said first state of the voltage pulse driving said substrate underlying said gate into deep depletion of charge carriers of said first conductivity type and said second state voltage pulse driving said substrate underlying said gate into a first magnitude of accumulation of said charge carriers of said first conductivity type;
    a second region in the surface of said substrate, adjacent to said first region and beneath said gate, having said first conductivity type of a magnitude greater than that of said substrate and a correspondingly higher threshold voltage;
    said substrate having concentration of said first conductivity type dopant of approximately $7 \times 10^{15}$ atoms per cubic centimeter and said second region has a concentration of said first conductivity type dopant of approximately $10^{17}$ atoms per cubic centimeter;
    said second state voltage pulse driving said second region beneath said gate into a second magnitude of accumulation of said charge carriers of said first conductivity type, greater than said first magnitude;
    a second gate electrode over said substrate and separated by said insulating layer;
    a third region of said first conductivity type in the surface of said substrate beneath said second gate electrode;
    said second gate electrode connected to ground potential;
    said third region and said second gate serving as a regulating capacitor so that the DC voltage level produced in said substrate by said pumping device will be regulated;
    a blanket layer in said substrate, of said first conductivity type which serves to distribute DC voltage level stored by said regulating capacitor throughout said substrate;
    said blanket layer being an electrical contact with said third region;
    whereby charge carriers of said second conductivity type which are injected from said first region into said substrate beneath the gate in response to the application of said voltage to said gate electrode will be prevented from rediffusing into said first region by the greater accumulation of said second region when said second state voltage is applied to said gate.

* * * * *